United States Patent
Manea

(10) Patent No.: US 6,714,448 B2
(45) Date of Patent: Mar. 30, 2004

(54) METHOD OF PROGRAMMING A MULTI-LEVEL MEMORY DEVICE

(75) Inventor: Danut I. Manea, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 108 days.

(21) Appl. No.: 10/190,374

(22) Filed: Jul. 2, 2002

(65) Prior Publication Data

US 2004/0004857 A1 Jan. 8, 2004

(51) Int. Cl.$^7$ .......................... G11C 16/04; G11C 16/06
(52) U.S. Cl. .......................... 365/185.03; 365/185.19; 365/185.22
(58) Field of Search .................. 365/185.03, 185.19, 365/185.22

(56) References Cited

U.S. PATENT DOCUMENTS

| | | | |
|---|---|---|---|
| 5,272,669 A | 12/1993 | Samachisa et al. | 365/185 |
| 5,434,825 A | 7/1995 | Harari | 365/185 |
| 6,275,415 B1 | 8/2001 | Haddad et al. | 365/185.11 |
| 6,327,183 B1 | 12/2001 | Pawletko et al. | 365/185.18 |
| 6,327,189 B2 | 12/2001 | Banks | 365/189.01 |
| 6,343,033 B1 | 1/2002 | Parker | 365/185.19 |
| 6,538,923 B1 * | 3/2003 | Parker | 365/185.03 |
| 2001/0006477 A1 | 7/2001 | Banks | 365/185.03 |

* cited by examiner

*Primary Examiner*—David Nelms
*Assistant Examiner*—Tu-Tu Ho
(74) *Attorney, Agent, or Firm*—Thomas Schneck

(57) ABSTRACT

A method of programming a multi-level memory chip in which the first, or lowest, voltage memory state through the next-to-last voltage memory state are programmed by a plurality of programming pulses increasing incrementally in voltage, alternated with a plurality of verify pulses, and in which the last, or highest, voltage memory state of the memory cell is programmed with a programming pulse of the threshold voltage required for charging the memory cell to the highest voltage memory state. The programming method provides accuracy in programming the intermediate memory states of the cell, while providing speed in programming the last memory state of the cell to increase the overall speed of the programming the memory cell.

16 Claims, 4 Drawing Sheets

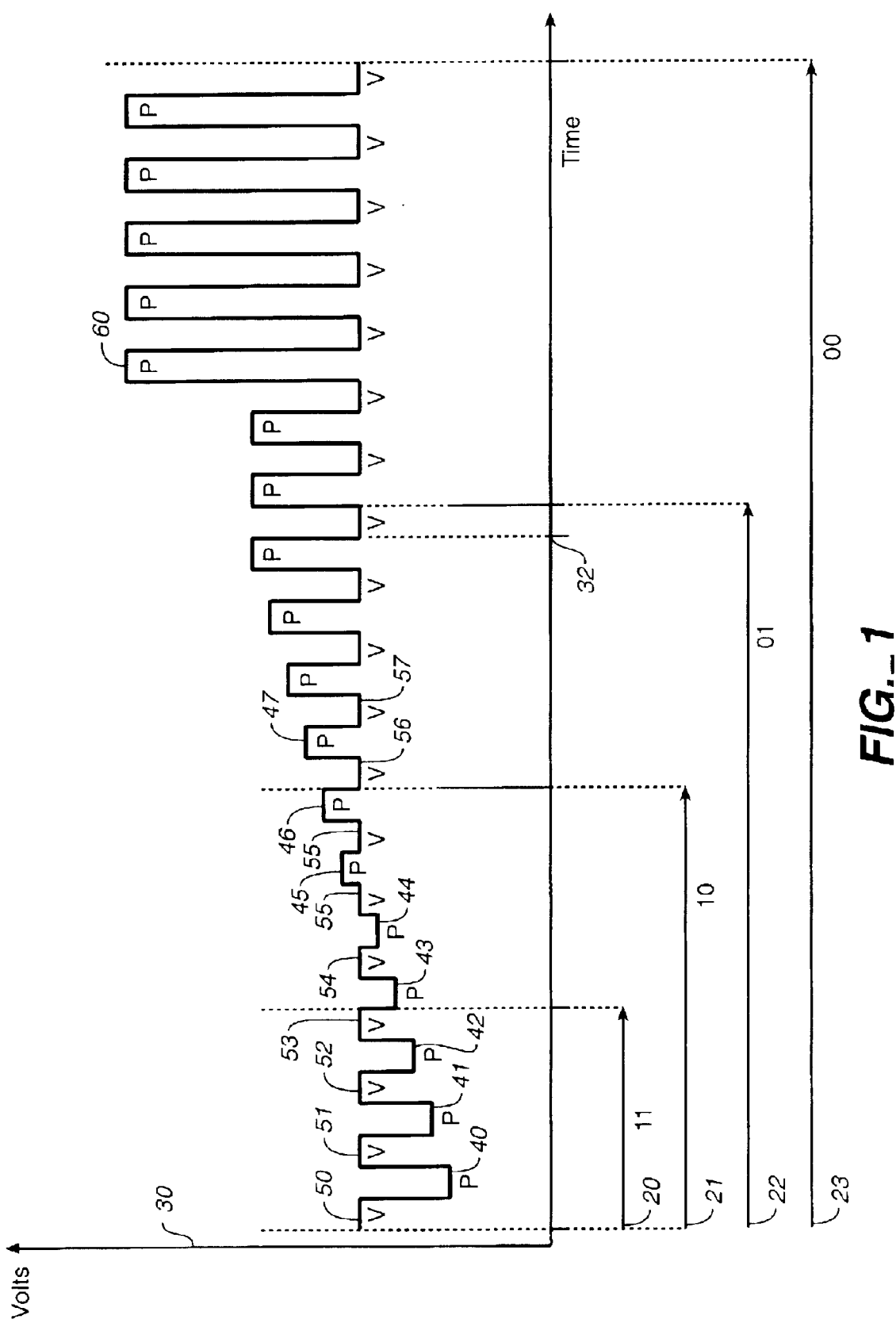
FIG._1

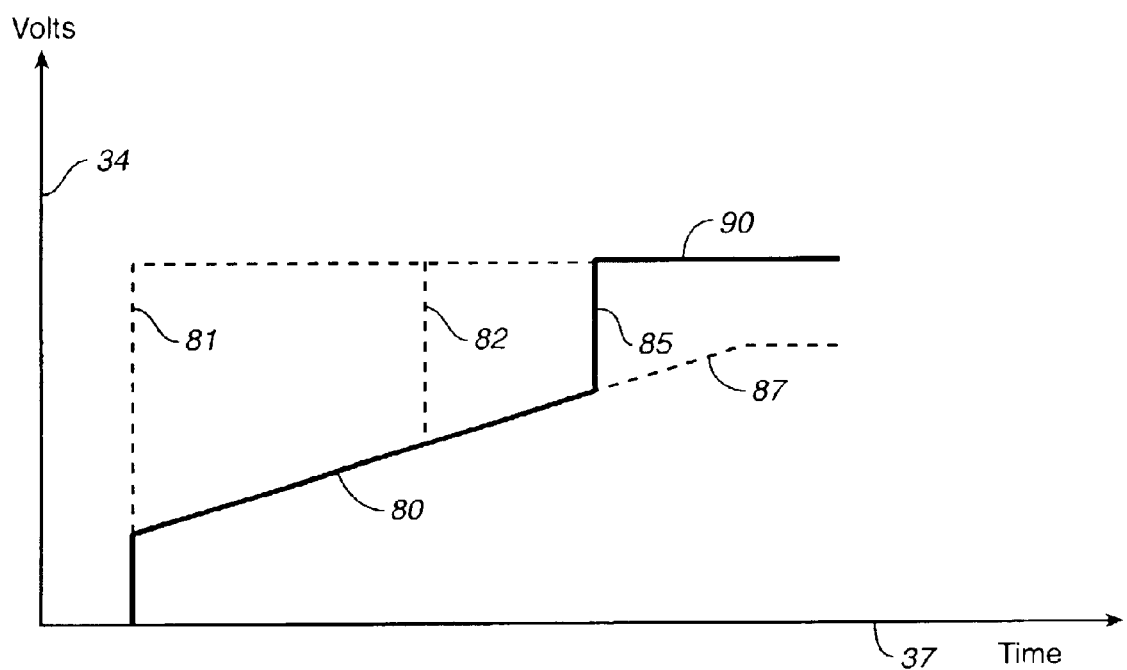
FIG._2

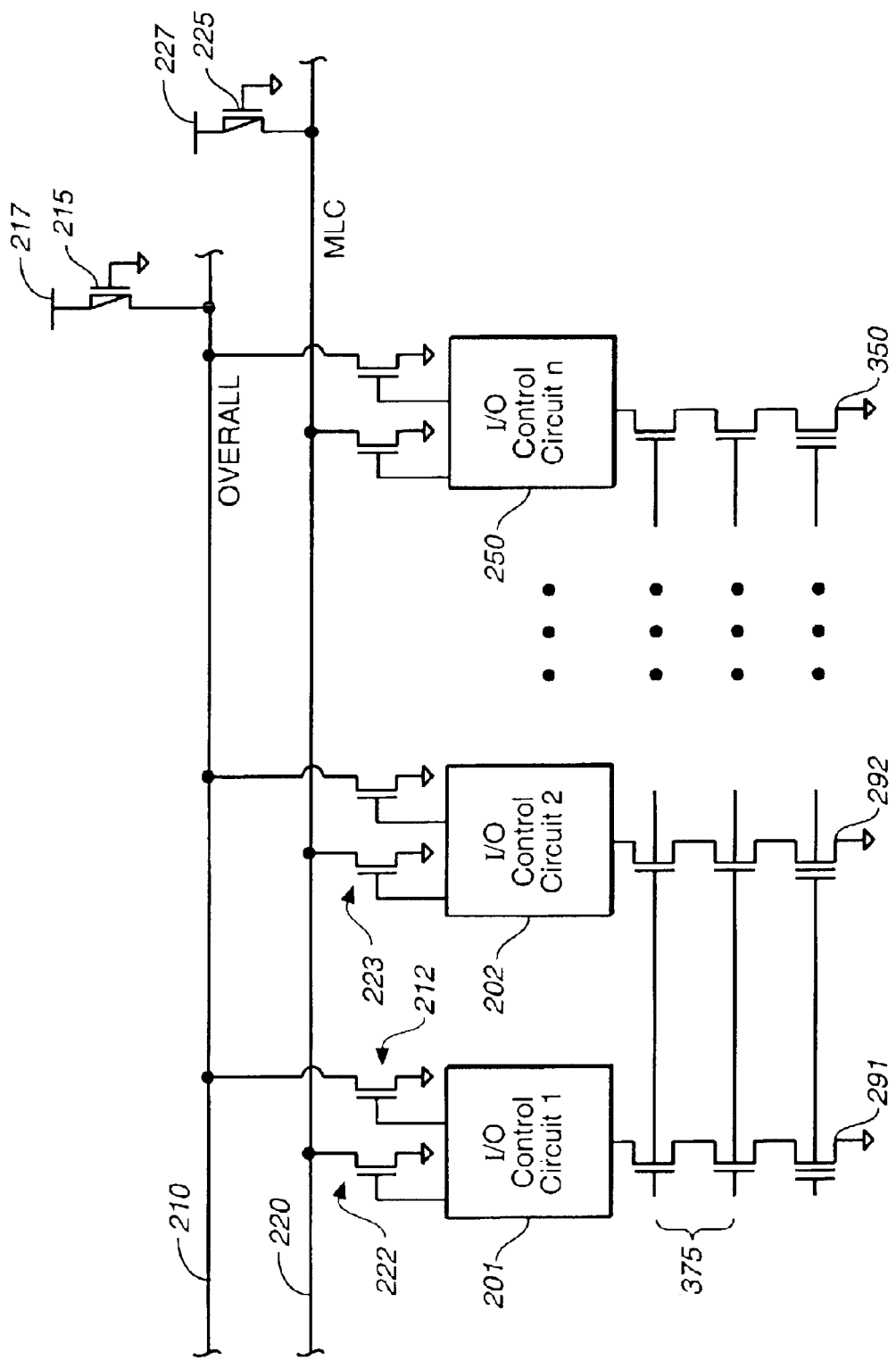
FIG._3

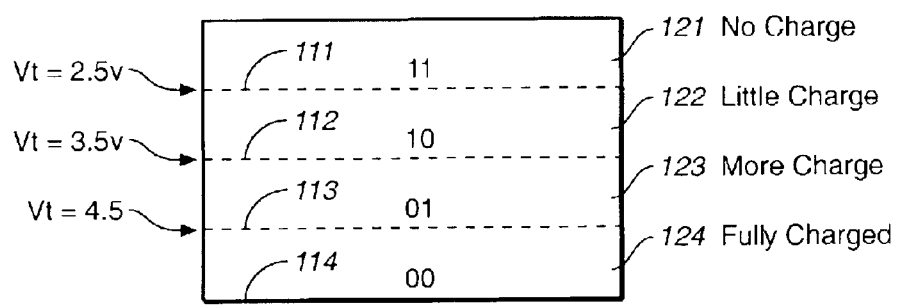
FIG._4
*(PRIOR ART)*
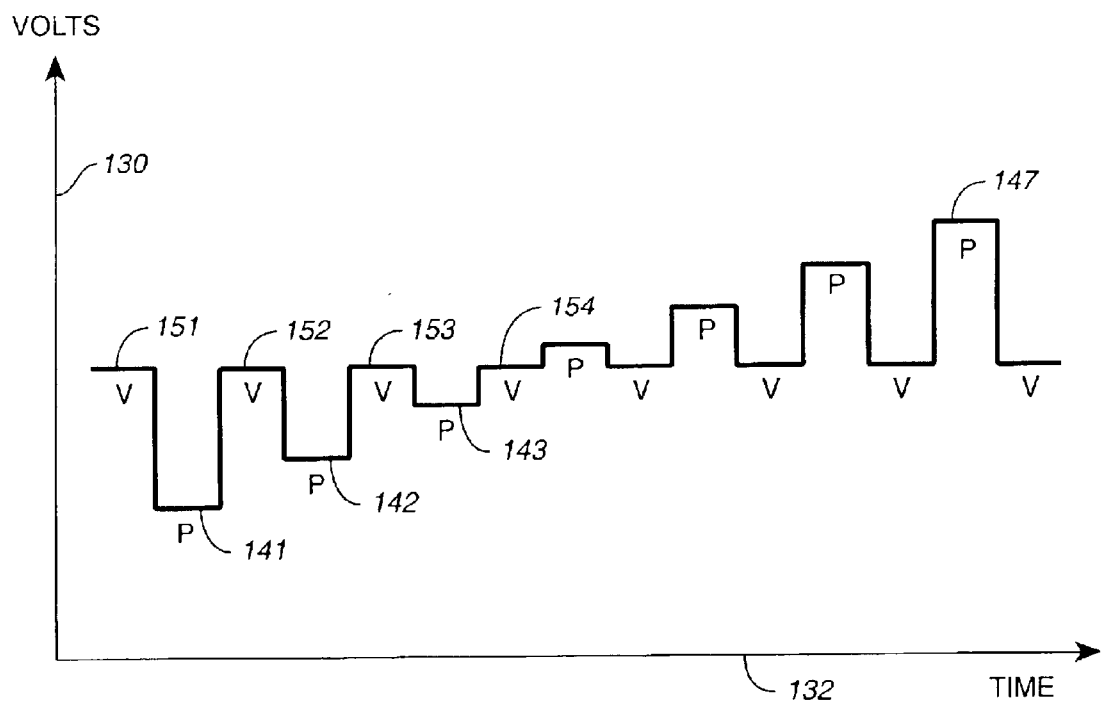
FIG._5
*(PRIOR ART)*

METHOD OF PROGRAMMING A MULTI-LEVEL MEMORY DEVICE

TECHNICAL FIELD

This invention relates to semiconductor memory devices, and more particularly to a method of programming multi-state memory devices.

BACKGROUND ART

One of the major issues in the development of semiconductor memory devices is to maximize data storage density, which is the number of bits of data that can be stored per unit area. It is generally desired to develop memory chips having the smallest possible physical size, while storing maximum amount of data. This has led to the development of memory chips that can store multiple bits of data in a single memory cell, also referred to as multi-level memory chips.

In conventional single bit per cell memory devices, the memory cell assumes one of two information storage states, either an on-state or an off-state. This combination of either on or off defines one bit of information. In bi-level memories, since the cells can only have two different values of threshold voltage, Vt, during the reading operation, it is only necessary to sense whether or not the addressed transistor is conductive. This is generally done by comparing the current flowing through the memory transistor biased with predetermined drain-to-source and gate-to-source voltages with that of a reference transistor under the same bias conditions, either directly through current-mode sensing or after a current-to-voltage conversion through voltage-mode sensing.

Programming and sensing schemes for multi-level memory devices are more complex, typically requiring $2^n-1$ voltage references., where n is the number of bits stored in the cell. With reference to FIG. 4, an example of a prior art multi-level memory device is shown having two bits per cell which corresponds to four memory levels having three voltage references. A first memory level 121, represented by the binary number 11, is the state in which the memory cell has no charge. The memory level 124 in which the memory cell is fully charged is represented by the binary number 00. (The terms "no charge" and "fully charged" are used herein, and throughout this discussion, for the purposes of explanation and are not intended to be limiting. For example, the (11) state could have a slight amount of charge and the (00) state could have an amount of charge less than the absolute maximum amount of charge.) In between the uncharged state (11) 121 and the fully charged state (00) 124 are a first intermediate level 122, represented by the binary number 10, in which the memory cell has a small amount of charge, and a second intermediate level 123, represented by the binary number 01, in which the memory cell has more charge than the 10 state but is not fully charged. The threshold voltages (Vt) shown in between each of the memory states of the memory cell represent the threshold voltages needed to transition between memory cell states. As discussed, for a two-bit cell having four memory levels, there are three voltage references 111, 112, 113. For example, at the threshold voltage of 2.5 volts, the memory state is at the reference level 111 where the state of the cell will transition from the 11 state to the 10 state. At a voltage threshold Vt=3.5 volts, the memory cell is at the reference level 112 where the state of the cell will transition from the 10 state to the 01 state. And at the voltage threshold of Vt=4.5 volts, the memory cell is at the reference level 113 where the state of the cell will transition from the 01 state to the 00 state. The threshold voltage values shown in FIG. 4 are merely illustrative and the actual values of Vt will depend on the construction of the memory cell.

In programming a typical flash memory cell, a potential (such as, for example, approximately 3–12 volts) is applied to the control gate of the cell, the source terminal is grounded, and the drain terminal is connected to a voltage of about 5 volts. This operation can be performed in an array by selectively applying the pulse to the word line which connects the control gates, and biasing the bit line which connects the drains. This is commonly known in the art as the hot electron injection method of programming flash memory cells. Hot electron injection is used to move charge in the floating gate, thus changing the threshold voltage of the floating gate transistor. By placing the high voltage on the control gate, this generates electrons to flow in the channel and some hot electrons are injected on to the floating gate and change the potential of the floating gate to be more negative. Therefore, injection tends to saturate and the threshold voltage of a floating gate transistor follows the same trend. The state of the memory cell transistor is read or sensed by placing an operating voltage (for example, approximately 4–6 volts) on its control gate and 0.5–1 volts on the drain, and then detecting the level of current flowing between the source and drain to determine which memory state the cell is in.

One of the main difficulties in implementing multi-level nonvolatile memory cells is being able to accurately program the cell, i.e. to place just the amount of charge on the floating gate of the cell transistor that is required to obtain the target value of the threshold voltage. The usual manner that is used in the prior art to deal with the problem of accurate charge placement is by using a cell-by-cell program and verify approach. In the program and verify approach, the programming operation is divided into a number of partial steps and the cell is sensed after every step to determine whether or not the target threshold voltage is achieved, so as to continue the programming if this is not the case. As each cell is independently controlled during programming, this technique allows simultaneous programming of a whole byte or even a number of bytes. This procedure ensures that the target Vt is reached, with the accuracy allowed by the quantization inherent in the use of finite programming steps. However, this process can be very long and must be controlled by on-chip logic circuitry.

A typical program and verify technique is illustrated in FIG. 5. As shown in FIG. 5, the programming of the memory cell is implemented by an alternating sequence of programming and verifying voltage pulses. The voltage 130 of each programming pulse incrementally increases with respect to time 132 until the desired target voltage is reached. The voltage level of the verify pulse remains constant throughout the programming process. For example as shown, after a first verify pulse 151, a first programming pulse 141 is implemented, and then a verify pulse 152 follows. A next programming pulse 142 of an incrementally increased potential is applied, followed by a verify pulse 153, followed by a third programming pulse 143 which is increased in voltage from the previous programming step, followed by a next verify pulse 154 and so on, until the final programming pulse 147 is applied to allow the cell to reach the threshold voltage of the desired memory state. As can be seen in FIG. 5, the shape of the graph resembles a staircase, and this programming method is generally known in the art as staircase gate voltage ramp programming. This staircase method is described in numerous patents, including, for example, U.S. Pat. Nos. 5,043,940; 5,268,870; 5,293,560; and 5,434,825.

In the prior art staircase programming methods, there is a tradeoff between speed and accuracy. A staircase having a smaller, more gradual, slope has better precision but the overall programming takes longer to complete, while a staircase having a steeper slope is faster but is less precise.

It is the object of the present invention to provide a method for programming a multi-level memory chip that provides both accuracy in programming and faster speed.

SUMMARY OF THE INVENTION

The above object has been achieved by a method of programming a multi-level memory chip that incorporates the staircase programming method of the prior art for programming the first, or lowest, voltage memory state through the next-to-last voltage memory state of the memory cell. Then, after determining that the memory state of all of the memory cells, other than those memory cells to be programmed to the last (highest) memory state, have been programmed, the programming pulse ramps up immediately to the programming voltage necessary to program the last voltage memory state. The method of the present invention provides for accurate programming throughout the various states of the memory cell. However, since the last state of the memory cell requires less accuracy, the method provides for immediate programming of the last voltage memory state of the memory cell, which increases the overall speed in programming the memory cell. Thus, the method of the present invention allows for faster programming of the memory cell without sacrificing the accuracy needed to place the exact amount of charge on the cell.

BRIEF DESCRIPTION OF THE DRAWINGS

FIG. 1 is a graph showing a possible voltage to time relationship of the program and verify pulse steps used in the present invention.

FIG. 2 is a graph showing the voltage to time relationship of the programming pulses for programming a two-bit memory cell having four memory states.

FIG. 3 is a schematic diagram of the circuit used for determining the programming status of the memory cell.

FIG. 4 is a representation of a two-bit memory cell having four memory states as is known in the prior art.

FIG. 5 is a graph showing the voltage to time relationship for the program and verify pulse steps of the staircase programming method, as is known in the prior art.

BEST MODE FOR CARRYING OUT THE INVENTION

With reference to FIG. 1, in a multi-level memory cell having two bits there are four memory states: the "11" memory state 20, the "10" memory state 21, the "01" memory state 22, and the "00" memory state 23. As discussed above, in the 11 state, there is no charge on the floating gate of the cell. The charge on the floating gate increases through the states 10 and 01 until, at state 00, the cell is fully charged. (Again, as noted above, the terms "no charge" and "fully charged" are used herein for the purposes of explanation and are not intended to be limiting.) The present invention is based on the realization that after a memory cell has been programmed to the next-to-last voltage memory state (in FIG. 1, this would be the "01 state" 25), it is not necessary to be as accurate in programming the cell to the fully charged state.

In FIG. 1 it can be seen that in programming the memory cell from the 11 state to the 10 state, a method similar to the prior art is used in which a series of programming pulses 40, 41, 42, increasing incrementally in voltage, are applied to the control gate of the memory cell in order to place a corresponding amount of charge on the floating gate. In between each of the programming pulses, a verify pulse 50, 51, 52 is applied in order to check the state of the cell. This program/verify process continues when the state of the memory cell is going from 10 to 01. Once the cell has reached the 01, or next-to-last, memory state (shown in FIG. 1 to be at time 32), a programming pulse 60 having a voltage level exceeding the threshold needed to place the memory cell in the last memory state (00) is applied to the memory cell. This allows the cell to reach the last memory state (00) in a much more rapid fashion than in the prior art. Because the slower program/verify approach is not necessary when programming the final maximum voltage memory state of the cell, by ramping the programming voltage up to the maximum threshold level immediately following the cell reaching the next to last state, the overall speed of programming the device memory cell is increased.

With reference to FIG. 2, the voltage 34 of the programming pulses is plotted with respect to time 37. When programming the memory cell from the 11 state to the 10 state, and when programming from the 10 state to the 01 state, the graph of programming voltage versus time would have a slope 80 that has a gradual increase, as is expected when using the staircase program/verify method. Then, when programming to the last state 00, the programming voltage is ramped up to the threshold voltage needed to program the cell to the 00 state. The slope of the line 85 is almost vertical and, as can be seen in the graph, the cell is programmed to the voltage level 90 of the 00 state very quickly.

It should be noted that slope of the line 80, representing the programming of the intermediate states 10 and 01, can be steeper or flatter, depending on how fast it is desired to program these intermediate levels. Programming the intermediate levels using the prior art staircase method requires a tradeoff between speed and accuracy. Therefore, the line 80 would have a steeper slope if more speed was desired, and would have less slope if more accuracy, requiring program/verify pulses, was desired.

As explained above, the memory cells in the 11, 10 and 01 states are programmed using the staircase program/verify method. When it is determined that all of the 11, 10, and 01 memory cells have been programmed, then this means that the only memory cells left to program would be the 00 memory cells. This triggers the change in the programming algorithm to ramp the programming voltage up to the threshold voltage needed to program the cell to the 00 state. As shown in FIG. 2, the ramping up to the maximum programming voltage may occur at any point in the staircase programming algorithm 80, depending on the programming speed of related memory cells and data content. For example, line 81 shows the voltage ramping step occurring soon after the beginning of the programming cycle, indicating that all of the cells need to be programmed to the 00 state. Line 82 illustrates a case having a programming speed not quite as fast, while the example with line 85 is a slower programming speed. The different lines shown in FIG. 2 are due to variability in programming speed and in the data to be programmed. Thus, the programming method of the present invention compensates for variability in programming speed in the memory array as the programming of the last memory state occurs immediately after all of the non-00 states have reached the desired programming levels.

Referring to FIG. 2, if the programming of the 00 state had been done by continuing to use the prior art staircase method, then the resulting slope 87 of the line would be less steep, and the 00 state would not be programmed until a later point in time. Additionally, it is possible that, using the staircase method, that the cell could become saturated before reaching the 00 state, so that the memory cell never reaches the last memory state. By immediately ramping up the programming voltage to the threshold voltage necessary to program the memory cell to the 00 state, this eliminates the problem of memory cells not reaching the programming level of the 00 state.

With reference to FIG. 3, a pair of signal lines 210 and 220 are used for determining the programming status of the memory cells connected to a particular column of the memory array. The individual memory cells are arranged in groups to be programmed. In the preferred embodiment, there are 32 memory cells in a group such that each group constitutes eight bytes of information. However, the groups can be of any size desired.

FIG. 3 shows a representation of the I/O control circuits 201, 202–250 for each of the memory cells 291, 292–350 in a group. One or more gating transistors 375 are usually provided between each I/O control circuits 201 and its respective memory cell 291. The I/O control circuits 201–250 each include sensing circuits and state machines for decision making in order to control the programming of the respective memory cells. The I/O control circuits can be designed in a number of various ways. The specific details of the I/O control circuits relating to the invention will be described below.

Each I/O control circuit 201–250 in a group of memory cells is connected through a first transistor 222 to a multi-level ready signal line 220 and through a second transistor 212 to an overall group ready signal line 210. Each of the transistors 222 and 212 are n-type MOS devices having a gate terminal connected to the I/O control circuit 201, a source terminal connected to signal ground and a drain terminal connected to the respective ready signal line 210, 220. The transistors 222 and 212 function as pull-down transistors, serving to pull down the voltage of the ready signal lines 220, 210. The multi-level ready signal line 220 indicates whether the memory cell is ready for the programming transition from the staircase programming method to the application of a maximum voltage programming pulse. The overall ready group signal line 210 indicates whether or not the programming of all of the cells in a particular group has been completed. Each signal line 210, 220 is connected to a weak p-type MOS transistor 215, 225 which serves as a pull-up transistor to pull up the voltage of the signal lines. Each pull-up transistor 215, 225 has a drain terminal connected to the respective signal line 210, 220, a gate terminal connected to signal ground, and a source terminal connected to a power supply voltage 217, 227.

Each I/O control circuit 201–250 has a state machine which communicates to a main memory controller (not shown) through the multi-level ready and overall group signal lines 220 and 210. When a memory cell has finished programming, its I/O control circuit 201 turns off its respective n-type pull-down transistor 222 to release that memory cell from the overall group signal line 210. The overall group signal line 210 remains in a low or "false" state if any of the pull down transistors 212 are on, since the pull down transistor 212 is a stronger device than the pull-up transistor 215. When all of the memory cells in a group on a column have been programmed to the desired levels, then all of the pull-down transistors 212 are off, and the overall group signal line 210 switches to a high, or "true", state. This signals the main memory controller to trigger a reset to allow the main memory controller to program the next group of memory cells. The overall group signal line 210 remains low, or "false", when any of the memory cells have not been fully programmed to the desired voltage level.

The multi-level signal line 220 is in a low state when the pull-down transistor 222 for any of the memory cells is on. A pull-down transistor 222 for a particular I/O control device 207 turns off when it receives a low control signal from the I/O control device 201. This releases the I/O device 201 from the multilevel signal line 220. The pull-down transistor 222 receives the signal to turn off in one of two conditions. In the first condition, when the memory cell is to be programmed to the maximum voltage programming state (00), then the I/O control device 201 immediately sends the signal to release that I/O control device from the multi-level signal line 220. This is to signal that no further multi-level programming is necessary. In the second condition, when the memory cell is to be programmed to a different state (11, 10, 01) than the maximum voltage programming state, then the I/O control device turns off the pull-down transistor 222 when the programming of that particular memory cell has been completed. Similar to the overall group signal line 210 described above, the multi-level signal line 220 is in a low state until all of the pull down transistors are off, and all of the I/O control circuits/memory cells have been released from the signal line 220. Then, the voltage on the signal line 220 is pulled up by pull-up transistor 225 to put the multi-level signal line 220 is in a high state.

When the overall signal line 210 is low and the multi-level signal line 220 is low, then the group of memory cells are programming using the program/verify staircase method. When the multi-level signal 220 goes to a high condition, this means that some of the cells have been programmed to the desired states (11, 10 or 01) and that the only cells left to be programmed are the 00 cells. At this point, the 00 cells have only been programmed to a non-determined state. Then the 00 cells receive the increased programming voltage to put these cells in the 00 state.

As an example of how the programming method of the present invention works, with reference to FIG. 3, assume that the memory cells for I/O control circuits 201 and 250 are to be programmed to the maximum voltage memory state (00), the memory cell for I/O control circuit 202 is to be programmed to the 01 state, and the rest of the group (not shown) are to be programmed to the 10 state. The overall group signal line 210 is reset and is in a low condition, meaning that the programming of the group is not complete. The I/O control circuits 201 and 208 immediately send signals to the multi-level signal line 220 to release those memory cells from multilevel signal line 220, since those memory cells will be programmed to the maximum state (00). The programming of the group of memory cells begins using the program/verify staircase method. When the programming voltage reaches the level in which those memory cells to be programmed to the 10 state have been programmed, then the I/O control circuits of those memory cells send signals to release their respective transistors from the multi-level signal line 220. However, due to variability in programming speed, this may not necessarily occur at the same moment in time. Thus, in this case, it is likely that the pull-down transistor 223 for I/O control circuit 202 is the only pull-down transistor still on. The program/verify staircase method continues until the memory cell for I/O control circuit 202 is programmed to the desired state (01). At this point, transistor 223 turns off and the multi-level signal line goes high. This signals a change in the programming method to instruct the memory controller to provide the maximum voltage programming pulse for programming the 00 memory cells 201, 250. When the memory cells 201, 250 have been programmed, then all of memory cells 201–250 in the group have been programmed and the respective I/O control circuit turns off the pull-down transistor 212 connected to the overall group signal line 210. Then, the overall group signal line 210 pulls up to a high condition, which signals the main memory controller that the programming has been completed and triggers a reset of the signal lines 210, 220.

In a preferred embodiment of the present invention, the bitline voltages supplied to each of the memory cells would be different for each different memory state. The lower memory states 11 and 10 would have lower bitline voltages in order to slow down the programming algorithm and provide better control, while higher bitline voltages would be used for the higher memory states 01 and 00. However, the present invention may also be implemented using the same bitline voltage for each different state, or using other variations of the bitline voltage from that described above.

The programming method of the present invention allows the overall programming of the cell to be faster than that of the prior art programming methods. However, it also allows for the accuracy needed in programming the intermediate states of 01 and 10. Thus, the present invention provides both accuracy and increased speed, and provides an improvement over the prior art method of programming multi-level memory cells. The memory cell described above having two bits and four memory states is exemplary, and the programming method of the present invention can be implemented with multi-level memory cells having any number of bits and corresponding memory states.

What is claimed is:

1. A method of programming a multi-level memory device comprising:
    applying a plurality of programming pulses to a set of memory cells of the memory device to place an amount of charge on a floating gate of each of said memory cells, said programming pulses increasing incrementally in voltage to increase the amount of charge on the floating gate until the amount of charge on the floating gate is equal to a desired amount of charge corresponding to a desired memory state of the memory cell;
    applying a plurality of verify pulses to the set of memory cells, each one of said verify pulses being applied after each one of the said programming pulses in an alternating manner, wherein said set of memory cells consists of a first subset of memory cells having a first desired memory state equal to a highest voltage memory state in which the cell has a highest amount of charge and a second subset of memory cells in which each memory cell has a respective second desired memory state that is less than the highest memory state;
    determining that each memory cell in the second subset of memory cells has been programmed to the respective second desired voltage memory state of each cell; and
    applying a maximum voltage programming pulse to each memory cell in the first subset of memory cells, wherein said maximum voltage programming pulse is equal to a voltage threshold level that results in the memory cell being in the first desired voltage memory state.

2. The method of claim 1 wherein the step of determining that the second subset of memory cells have been charged to the respective second designed memory state includes;
    providing a plurality of I/O control circuits each I/O control circuit being connected to an individual memory cell of the set of memory cells;
    providing a plurality of signal lines connected between the plurality of I/O control circuits and a memory controller of the memory device;
    sending a first signal from each of the I/O control circuits connected to a memory cell in the first subset of memory cells to a first signal line to indicate that the memory cell is to be charged to the first desired voltage memory state; and
    sending a second signal from each of the I/O control circuits connected to a memory cell in the second subset of memory cells to the first signal line when the memory cell has reached the respective second desired memory state to indicate that programming of the memory cell is completed.

3. The method of claim 2 further comprising:
    before the step of applying the maximum programming pulse to each memory cell in the first subset of memory cells, sending a third signal from each of the I/O control circuits connected to a memory cell in the first subset of memory cells to a second signal line to indicate that programming of the memory cell in the first group of memory cells is not completed.

4. The method of claim 3 further comprising:
    after the step of applying the maximum programming pulse to each memory cell in the first subset of memory cells, sending a fourth signal from the I/O control circuit of each memory cell in the first subset of memory cells to the second signal line to indicate that programming of the memory cell is completed.

5. The method of claim 2 wherein the first signal connects the I/O control circuit to the first signal line and the second signal disconnects the I/O control circuit from the first signal line.

6. The method of claim 3 wherein the third signal connects the I/O control circuit to the second signal line.

7. The method of claim 4 wherein the fourth signal disconnects the I/O control circuit from the second signal line.

8. A method of programming a multi-level memory device comprising:
    connecting a plurality of memory cells to a wordline in a memory array of the multi-level memory device, each of the plurality of memory cells also being connected to a respective I/O control circuit;
    providing a plurality of signal lines, including a first and a second signal line, each of the plurality of signal lines being connected between the I/O control circuits and a memory controller of the memory device;
    applying a plurality of programming pulses to a set of the plurality of memory cells to place an amount of charge on a floating gate of each of said memory cell, said programming pulses increasing incrementally in voltage to increase the amount of charge on the floating gate until the amount of charge on the floating gate is equal to a desired amount of charge corresponding to a desired memory state of the memory cell;
    applying a plurality of verify pulses to the set of memory cells, each one of said verify pulses being applied after each one of the said programming pulses in an alternating manner, wherein said set of memory cells consists of a first subset of memory cells having a first desired memory state and a second subset of memory cells each having a respective second desired memory state that is less than the highest memory state;

determining that the second subset of memory cells have been programmed to the respective second desired voltage memory state; and applying a maximum voltage programming pulse to each memory cell in the first subset of memory cells, wherein said maximum voltage programming pulse is equal to a voltage threshold level that results in the memory cell being in the first desired maximum voltage memory state.

9. The method of claim 8 wherein the step of determining that the second subset of memory cells have been charged to the respective second desired memory state includes:

sending a first signal from each of the I/O control circuits connected to a memory cell in the first group of memory cells to a first signal line to indicate that the memory cell is to be charged to the first desired voltage memory state; and sending a second signal from each of the I/O control circuits to the first signal line when the memory cell has reached the respective second desired memory state to indicate that programming of the memory cell is completed.

10. The method of claim 9 further comprising:

before the step of applying the maximum programming pulse to each memory cell in the first subset of memory cells, sending a third signal from each of the I/O control circuits connected to a memory cell in the first group of memory cells to the second signal line to indicate that programming of the memory cell in the first subset of memory cells is not complete; and after the step of applying the maximum programming pulse to each memory cell in the first subset of memory cells, sending a fourth signal from the I/O control circuit of each memory cell in the first subset of memory cells to the second signal line to indicate that programming of the memory cell is completed.

11. The method of claim 10 further comprising:

resetting the memory controller when the I/O control circuits of each of the plurality memory cells in the first subset of memory cells have sent the fourth signal to the second signal line.

12. The method of claim 8 wherein the set of the plurality of memory cells includes 32 memory cells.

13. The method of claim 8 wherein the multi-level memory device has N voltage levels, where N is a value greater than 2.

14. The method of claim 8 wherein the multi-level memory device has four voltage levels.

15. The method of claim 8 further comprising:

supplying a bitline voltage to each of the set of memory cells, said bitline voltage having a voltage value that corresponds to the desired memory state of the memory cell.

16. The method of claim 15 wherein the voltage value of the bitline voltage is higher for memory cells in the first subset of memory cells than for memory cells in the second subset of memory cells.

* * * * *